United States Patent
Dalal et al.

[11] Patent Number: 5,808,853
[45] Date of Patent: Sep. 15, 1998

[54] CAPACITOR WITH MULTI-LEVEL INTERCONNECTION TECHNOLOGY

[75] Inventors: Hormazdyar M. Dalal, Milton; Gene Joseph Gaudenzi, North Salem; Rebecca Y. Gorrell, Lagrangeville; Mark A. Takacs, Poughkeepsie; Kenneth J. Travis, Jr., Newburgh, all of N.Y.

[73] Assignee: International Business Machines Corporation, Armonk, N.Y.

[21] Appl. No.: 846,930

[22] Filed: Apr. 30, 1997

Related U.S. Application Data

[63] Continuation-in-part of Ser. No. 740,571, Oct. 31, 1996, Pat. No. 5,729,896.

[51] Int. Cl.[6] .................................................. H01G 4/228
[52] U.S. Cl. ......................... 361/306.1; 361/308.2; 257/238; 257/772; 257/780
[58] Field of Search ........................... 361/306.01, 305, 361/301.3, 301.1, 306.2, 306.3, 308.2, 321.2, 321.3, 321.4, 321.5, 299.3, 298.4, 734, 811; 29/840, 841, 29.42, 842; 228/180.21, 180.22, 256; 148/512, 528; 438/614, 669; 257/737, 738, 772, 778, 780

[56] References Cited

U.S. PATENT DOCUMENTS

| | | | |
|---|---|---|---|
| 3,638,083 | 1/1972 | Dornfeld et al. | 361/321.1 |
| 4,967,950 | 11/1990 | Legg et al. | 228/180.2 |
| 5,075,965 | 12/1991 | Carey et al. | 29/840 |
| 5,130,779 | 7/1992 | Agarwala et al. | 357/67 |
| 5,238,176 | 8/1993 | Nishimura | 228/256 |
| 5,251,806 | 10/1993 | Agarwala et al. | 228/180.22 |
| 5,290,732 | 3/1994 | Kumar et al. | 437/183 |
| 5,391,514 | 2/1995 | Gall et al. | 437/183 |
| 5,451,274 | 9/1995 | Gupta | 148/512 |
| 5,470,787 | 11/1995 | Greer | 437/183 |
| 5,478,420 | 12/1995 | Gauci et al. | 156/89 |
| 5,597,469 | 1/1997 | Carey et al. | 205/118 |
| 5,634,268 | 6/1997 | Dalal et al. | 29/840 |

FOREIGN PATENT DOCUMENTS 62-117346  5/1987  Japan ............................. H01L 21/92

OTHER PUBLICATIONS

Dawson, et al., "Indium–Lead–Indium Chip Joining", IBM Technical Disclosure Bulletin, vol. 11, No. 11, Apr. 1969, p. 528.

Microelectronics Packaging Handbook, edited by Rao R. Tummala and Eugene J. Rymaszewski, pp. 366–391 (1989).

Milkovich et al., "Double Sided Flexible Carrier with Discretes and Thermally Enchaned FCA/COF", IEEE 43rd ECTC Proceedings, Jun. 1993, pp. 16–21.

Milkovich et al., U.S. application No. 08/071630, entitled "Manufacturing Flexible Circuit Board Assemblies with Common Heat Spreader", filed on Jun. 3, 1993.

*Primary Examiner*—Kristine L. Kincaid
*Assistant Examiner*—Anthony Dinkins
*Attorney, Agent, or Firm*—Aziz M. Ahsan

[57] ABSTRACT

This invention is directed to a capacitor having a multilevel interconnection technology. At least one solder ball is reflowed and secured onto the capacitor. The solder ball is in electrical communication with the capacitor through a contact. On this reflowed solder ball a cap of low melting point metal is secured. This can be done in a number of ways. The preferred way is to positioning a mask over the solder ball such that a portion of the solder ball is exposed through openings in the mask. At least one layer of a low melting point metal is deposited on the exposed surface of the solder ball through the mask, and thereby forming a capacitor with a multilevel interconnect cap. The low melting point metal can interact with the surface of the solder ball to form a cap of an eutectic or a liquefied portion. The cap portion can then be joined to the object.

22 Claims, 1 Drawing Sheet

CAPACITOR WITH MULTI-LEVEL INTERCONNECTION TECHNOLOGY

CROSS-REFERENCE TO RELATED PATENT APPLICATIONS

This patent application is a Continuation-In-Part patent application of U.S. patent application Ser. No. 08/740,571, entitled, "FLIP CHIP ATTACH ON FLEXIBLE CIRCUIT CARRIER USING CHIP WITH METALLIC CAP ON SOLDER", filed on Oct. 31, 1996, U.S. Pat. No. 5,729,896 assigned to the assignee of the instant patent application, and the disclosure of which is incorporated herein by reference.

This patent application is also related to U.S. patent application Ser. No. 08/846,931, filed on Apr. 30, 1997, now U.S. Pat. No. 5,729,896, entitled "CAPACITOR WITH MULTILEVEL INTERCONNECTION TECHNOLOGY AND PROCESS THEREOF", assigned to the assignee of the instant Patent Application, and the disclosure of which is incorporated herein by reference.

FIELD OF THE INVENTION

The present invention relates to an improved low temperature capacitor attachment method for circuit carriers using flip chip attach (FCA) technology. More particularly, the invention relates to a structure where at least one multi-dielectric layered capacitor can be directly attached to a substrate using multilevel interconnection technology. A method for such direct capacitor attachment to a card is also disclosed.

BACKGROUND OF THE INVENTION

Electronic products are typically comprised of a plurality of electrical components. Examples of electrical components include, but are not limited to, logic chips, memory chips, register chips, resistors, capacitors, to name a few.

At least three hierarchial levels of assembly are usually necessary in the production of electronic products for high-end computer CPUs where performance of complex functions is necessary.

At the first level of the hierarchical assembly the components are usually connected to carriers made of ceramic or organic laminates and the assembled carriers, along with sealing and cooling methodologies known in the art, are called modules.

There are a number of types of carriers commonly known in the art including, ceramic and organic laminates. Generally, ceramic carriers are made of alumina or glass. Ceramics are robust but tend to be high cost. There are two types of organic laminates, one type is generally made of epoxy compounds and is generally thick and stiff. The other type of organic laminate is made of polyimide and is flexible. The carriers generally contain at least one layer of metal interconnection lines.

At the second level of the assembly hierarchy, the modules are connected to cards. The cards are usually made of organic laminates with printed circuits on at least one side of the card.

At the third level of the assembly hierarchy the cards are connected to boards.

The capacitors typically used in the electronic circuits generally have negligibly small inductance. Historically, this has been true because the back voltage produced by a sudden flow of current due to the simultaneous switching of several circuits is detrimental. The back voltage must therefore be minimized at every possible point. However, the methods used for electrically and mechanically attaching discrete capacitors to circuit carrier cards tend to lead to high inductance capacitors. There are a number of attachment methods used in the industry.

One attachment method which is the wire bond technique has historically imposed high inductances because current has to travel along the length of the wire.

Another attachment method which is TAB (tape-automated-bonding) is mostly used for attaching integrated circuit chips. It has been found that TAB will also further increase the inductance in capacitors.

A third attachment method which is using the C4 (Controlled Collapse Chip Connection) technology. The C4 attachment method, has been successfully employed for first level assembly of chips. The C4 interconnection is basically comprised of two main elements, a solder wettable pad called ball limiting metallurgy (BLM), and a ball of solder. The BLM is usually comprised of an adhesive layer, such as, Cr or TiW, and a solder reflowable layer, such as, copper or nickel. The BLM materials and their thicknesses are judiciously chosen to provide reliable electrical, mechanical and thermal stability for the interconnect structures. The solder material used for C4 is preferably a low percentage tin/lead alloy. The lead/tin alloy is typically used to reduce the reaction between the copper in the BLM and the tin, because copper-tin intermetallics form a high stress film which cracks the polyimide, a passivation on the chip. Additionally the alloy is used to achieve more desirable thermal fatigue characteristics.

Ceramic substrates are undesirable because they are less compatible with present design considerations. For example, product miniaturization, especially in some microprocessing areas, cost reduction and low inductance requirements make it difficult to effectively use ceramic substrates for packaging. Presently, there are concerns that limit the use of current C4 technology for direct chip attachment (DCA) on carrier cards. The foremost problem is the relatively high joining temperature (between about 340° C. to about 380° C.) for standard C4s. The joining temperature being higher than the phase transition temperature of the organics used in the card thus precludes the use of organic card materials.

There are generally two ways to lower the DCA joining temperature, and both ways would alleviate the problem cited above. Either the substrate can be modified or treated to achieve the desired results, or the solder ball can be modified or treated to achieve the desired results.

A number of approaches treat or modify the substrate. The general scheme for attaching IC chips to organic circuit carrier cards having C4s involves a "tinned" substrate. The "tinned" substrate consists of a standard substrate treated with an alloy of eutectic composition in the contact regions, also called pre-coating. The precoated substrate is then interacted with the standard C4 solder balls on the base of the chip.

A second approach for lowering the joining temperature for Direct Chip Attach (DCA), is to provide a low melting solder-on-chip (SOC) C4. In one method, an eutectic alloy is formed from a sufficiently thick, heterogeneous, anisotropic column consisting of a lead rich bottom and a tin rich top. The resulting unreflowed column is then joined onto the card's conductor. In such heterogeneous schemes, the tin rich top material reacts with the lead rich bottom material to form an eutectic alloy. However, the eutectic composition is only transient because lead and tin rapidly interdiffuse to form a solder alloy with a tin content which is less than that of the eutectic alloy. The resulting alloy has a melting point which is higher than the required eutectic temperature and forms a poor joint. Further, the problem of BLM degradation, due to a higher tin content remains.

One method to circumvent the thermodynamically driven tendency for interdiffusion involves a structure where the low melting point component is separated from the high melt component by a barrier metal layer. This structure does show a hierarchy of solder material. However, in this structure the columns of high melting solder are generally not reflowed. Since the stacked solder are not reflowed, there is no metallurgical reaction between the solder stack and the adhesive pad of BLM. Poor mechanical integrity of the C4 joint is known to exist if there is no metallurgical reaction between the solder stack and the adhesive pad of the BLM.

Another method involves the use of a heterogeneous solder stack of Tin-Lead-Tin. In this method, the bottom layer of tin is utilized to make an intermetallic compound with the copper in the BLM. The intermetallic compound adds mechanical strength. A top layer of tin alloys with the underlying lead. The top tin/lead alloy provides a localized eutectic formation, but only as a transient state. The transitory liquid phase formation is one aspect of reflow joining that must be avoided as it tends to result in a poor chip joining yield.

The manufacturability aspects of chip joining become even more sensitive if the heterogeneous solder stack is composed of metals with thermodynamic potential for intermetallic compound formation, e.g., gold-tin metallurgy for TAB. In such cases, one has to be careful to heat only the tin portion of the heterogeneous stack.

For the purposes of this invention a solder ball composed completely of a low melting point composition is undesirable because the high tin content reacts with the copper of the adhesive layer (BLM) resulting in a thick intermetallic layer. High stresses in reacted BLM have been known to cause solder pad failure and delamination and also result in insulation cracking. Additionally, eutectic solder bumps composed entirely of low melting point metals tend to have poor electromigration and shorter thermal fatigue lifetimes. It is also known that low melting eutectic solder can increase void formation due to thermal migration. Void formation and thermal migration can cause circuit failure.

Yet another drawback of a heterogeneous, anisotropic solder column is that this structure is not conducive to electrical testing of circuitry. It is desirable to test circuitry before joining the chips to carriers as the electrical probes can gouge into a low melting point covering during testing and degrade the integrity of the solder ball.

Thus, there remains a need for a method for attaching a capacitor, having a plurality of electrodes to a card. One way this can be achieved is by providing a solder assembly where a high melting point solder is covered on the top surface with a low melting point metal. And, upon subsequent reflow the low melting point metal forms an eutectic solder with at least a portion of the high melting point solder.

SUMMARY OF THE INVENTION

It is therefore a purpose of the present invention to provide a method and structure for providing direct device attachment to organic circuit cards.

It is another purpose of the present invention to provide a method for preparing capacitors for direct device attachment.

It is yet another purpose of this invention to provide a method for simultaneously joining devices on card using the direct chip attachment, and other technologies.

It is a further purpose of this invention to provide a circuit card/capacitor assembly which has increased performance.

It is still another purpose of this invention to have a capacitor/carrier card assembly which is compatible with electrical test and burn-in protocols.

Thus, in one aspect the present invention comprises a process of forming a capacitor with at least one low melting point metallic cap, comprising:

(a) securing at least one high melting point solder ball to said capacitor, such that said solder ball is in electrical communication with said capacitor, (b) positioning a mask having at least one opening over said solder ball, such that at least a portion of said opening in said mask accommodates and exposes at least a portion of said solder ball, (c) depositing at least one layer of at least one low melting point metal through said opening in said mask over said exposed surface of said solder ball, and thereby forming said capacitor with said at least one low melting point metallic cap.

In another aspect the present invention comprises a package comprising, a device carrier and at least one capacitor electrically connected to said device carrier with at least one solder ball, wherein said solder ball comprises a high melting point solder in communication with an electrical feature on said capacitor, a portion of said solder ball having a coating of at least one low melting point metal, and wherein a portion of said low melting point metal forms an eutectic fillet, and wherein said eutectic fillet is in electrical contact with said device carrier and thereby forms said package.

In yet another aspect the present invention comprises a capacitor comprising at least one solder ball, wherein said solder ball comprises a high melting point solder in communication with an electrical feature on said capacitor, a portion of said solder ball having a coating of at least one low melting point metal, and thereby forming said capacitor.

In still another aspect the present invention comprises a capacitor comprising at least one solder ball, wherein said solder ball comprises a high melting point solder in communication with an electrical feature on said capacitor, a portion of said solder ball having a coating of at least one eutectic solder, and thereby forming said capacitor.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like members represent like features in the drawings. The invention itself, however, both as to organization and method of operation, may best be understood by reference to the detailed description which follows, taken in conjunction with the accompanying drawings in which:

DETAILED DESCRIPTION OF THE INVENTION

It should be noted that the term "solder ball" as used in conjunction with this invention means that lead and tin have been combined and gone through at least one reflow cycle and formed a "solder ball". The term solder ball assembly as used in conjunction with this invention means that the solder ball has interacted and reflowed with a contacting means. The contacting means is the connection between the solder ball and the underlying object and can be the BLM. Therefore, it should be apparent to one skilled in the art that the invention is an improvement of these already formed solder balls or C4s.

The method of the invention teaches the formation of a solder ball configuration where a low melting point metal is deposited on an already reflowed lead-tin solder ball. A low melting point metal is a metal with a melting point below about 250° C. Similarly, a high melting point metal is a metal with a melting point above about 250° C. The reflowed lead-tin solder ball interacts and forms an alloy with the overlying low melting point metal. Only a portion of the lead in the lead-tin solder ball thermodynamically reacts such that only a volume of an eutectic solder-tin alloy is formed on the solder ball. It was found that relatively little or no further interdiffusion takes place, even after multiple eutectic melting cycles. A volume of eutectic liquid remains present, whenever the joint temperature is raised to eutectic temperature, even after joining the covered solder ball to an object. This is in contrast to the heterogeneous stacked metals where the eutectic liquid phase is transitory. Here, a desired volume of eutectic liquid on the top of a solid solder mass is formed without any need for a barrier.

A solder interconnection method that uses solder balls capped with a low melting point metal is desirable. The method allows direct capacitor attachment to any of the higher levels of packaging substrate. This method does not need tinning of the carrier or substrate. It has also been noticed that whenever temperature is raised slightly above the eutectic temperature, the liquid eutectic solder flows on all sides of the wire forming a liquid solder fillet. A fillet is a ribbon of solder which is in molten form and is flowed on a surface. This liquid fillet formation results in substantial improvements in thermal fatigue life since stress is reduced at the interface. Additionally, the formation of the liquid fillet provides an easy means to remove chips if chip replacement and field repairs are required. Performance and yield can be increased with the method and structure of this invention.

These methods, techniques and metallurgical structures facilitate direct attachment of devices of varying complexity to any substrate and to any level of packaging hierarchy; thereby, making the products more economical, increasing design options and making the products more compact.

Figure 1:
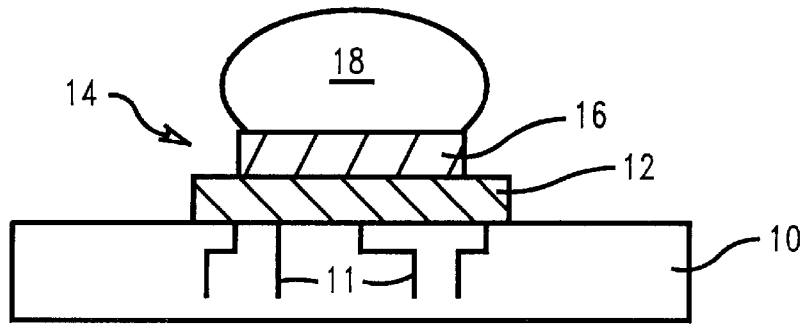
FIG. 1, shows a cross-section of a conventional high melting point C4, depicting a reflowed solder ball and assembly.

Referring now to the drawings in general, wherein like reference numerals represent the same or similar parts throughout, and to FIG. 1, specifically, a cross-section of a conventional solder ball 18, such as, a C4, on a multilevel dielectric capacitor 10, is shown. In this instance, the solder ball 18, is a reflowed high melt solder ball (about 97 percent Pb with about 3 percent Sn) on a solder wettable pad BLM 16. The solder wettable pad BLM 16, is in contact with a shorting bar 12.

The shorting bar 12, electrically connects to the internal electrodes 11, of the capacitor 10. There may be a number of shorting bars connecting different sets of electrodes to provide a range of capacitance values. The shorting bar 12, could be selected from a group comprising Cr, Cr-Cu-Cr, Cr-Cu, Ti, TiW, Al, or alloys thereof.

The solder ball 18, typically has a melting point which is higher than about 250° C. The solder ball 18, may comprise of Ag, Au, Bi, In, Pb, Sn, or alloys thereof. The solder ball 18, could be formed by any means known in the art. A solder ball assembly consists of the layers between the solder ball and the underlying structure.

In FIG. 1, for example, the solder ball is represented by 18, and the underlying structure is a multilevel dielectric capacitor 10. The solder wettable pad BLM 16, and the shorting bar 12, form a physical connection. Solder ball assembly 14, is the combination of the solder ball 18, the solder wettable BLM 16, and the shorting bar 12.

Figure 2:
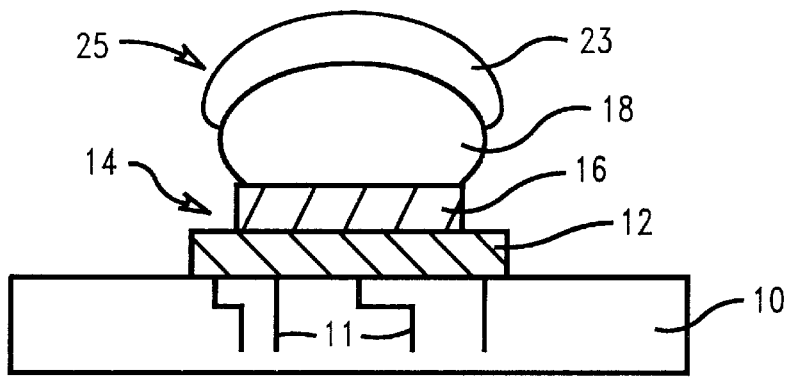
FIG. 2, illustrates a preferred embodiment of this invention where a cap of low melting point metal has been deposited on the top of the starting C4 structure of FIG. 1.

FIG. 2, illustrates a preferred embodiment of this invention where a cap of low melting point metal 23, such as, a low melting point solder 23, is deposited on the top surface of the starting solder ball 18, to form a capped solder ball 25. It is preferred that the cap of low melting point metal 23, is selected from a group comprising bismuth, indium, tin, or alloys thereof. In a more preferred embodiment the cap of low melting point metal 23, is tin. Any of these metals can be deposited by electroplating or by evaporation or by using any other method known in the art.

Figure 3:
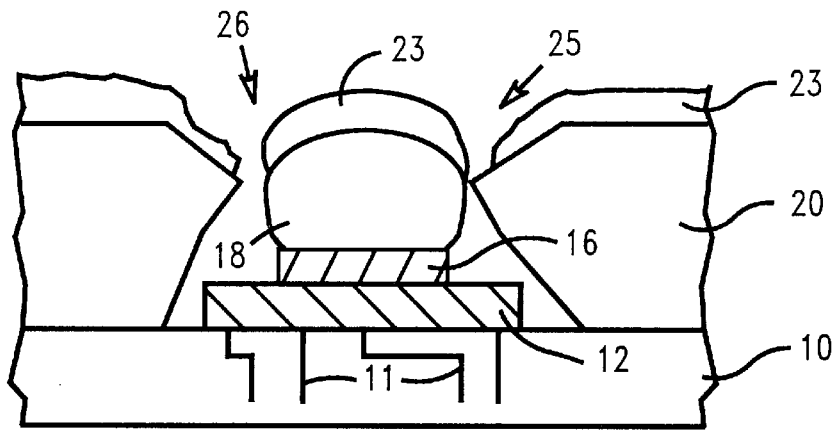
FIG. 3, illustrates a cross-section of an intermediate step which occurs during the fabrication of the inventive structure of FIG. 2.

FIG. 3, illustrates one embodiment of the invention showing a cross-section of the solder ball 18, after a mask 20, such as, a metal mask 20, has been aligned on the C4 solder balls 18. The metal mask 20, that is used in FIG. 3, can be the same as or different from the initial mask used to deposit the high melting point solder 18. The metal mask 20, can be aligned using a 'jig and fixture' configuration, which holds a collection of individual discrete capacitors 10, in place. The jig and fixture configuration can be achieved by any means known in the art. The low melting point metal 23, is then deposited on the top of the solder ball 18. This results in a capped solder ball 25, which comprises the solder ball 18, having a cap of the low melting point metal 23.

Figure 4:
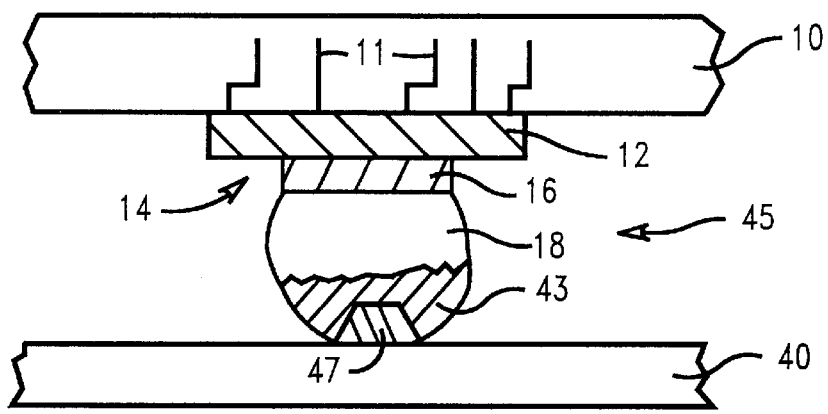
FIG. 4 is an enlarged cross-section of a single tin capped solder ball interconnect shown in FIG. 2, after it has been joined.

FIG. 4, shows a cross-section of the capped solder ball 25, after it has been joined to a circuit carrier card 40, having metallurgy 47, and forming a solder joint 45. The metallurgy 47, could be a line or a pad. The metallurgy 47, could be selected from a group comprising Cu, Cr, Fe, Ni, Au, Co, phased Cr-Cu, or alloys thereof. Preferably the metallurgy 47, is copper (Cu).

During the joining heat cycle, the low melting point metal covering 23, also known as a cap 23, on the solder ball 18, alloys with the solder ball 18, to form an eutectic composition 43, which melts at about 183° C. The amount of eutectic composition 43, that is formed will depend upon the amount of low melting point metal 23, that is deposited on top of the solder ball 18.

The volume of eutectic composition 43, interacting must be sufficient to envelope the metallurgy 47, that is exposed. The amount of low melting point metal 23, deposited on the top of the solder ball 18, depends on a number of factors. A low melting point metal 23, should, but does not necessarily have to, comply with all of the following parameters. First, the total volume of eutectic liquid should be at least about 10 cubic mil and at most about 40 cubic mil. For example, a tin cap 23, with a thickness of about 0.7 to about 2.5 mil will create the necessary volume of eutectic composition 43. Preferably, the volume of eutectic composition 43, is between about 12 cubic mil and about 35 cubic mil, which corresponds to a tin thickness of about 0.8 to about 1.6 mil. Second, the volume of eutectic 43, formed should be at least about 5 percent and at most about 90 percent of the volume of the solder ball 18. Preferably the volume of eutectic 43, is about 35 percent of the volume of the solder ball 18. Third, the metal 23, should cover at least about 10 percent and at most about 90 percent of the exposed surface of the solder ball 18. Preferably, the metal 23, should cover at least about 30 percent and at most about 50 percent of the exposed surface of the solder ball 18. Third, the average thickness of the low melting point metal 23, should be at least about 15 and at most about 50 micrometers. Preferably, the average thickness of the low melting point metal 23, is about 35 micrometers.

In a preferred embodiment, the maximum reflow join temperature is between about 190° C. to about 260° C. and is maintained for at least about 15 and at most about 90 seconds. Also in a preferred embodiment, the reflow join temperature is at least about 183° C. for at least about 30 seconds and at most about 5 minutes.

Suitable encapsulant can be provided over and under a device in order to protect the electrical connections between the devices, (e.g. the capacitor 10, and the circuit card 40) and cured. The use of encapsulation is optional because of the very small dimension of the capacitor 10, and also because there is limited heat generation in capacitors.

In a preferred embodiment, the mask 20, designed to have appropriate openings 26, is aligned on a capacitor 10, having a solder ball assembly 14, and solder ball 18, attached. (See FIG. 3.) The mask 20, should expose an area comprising at least the top of the solder ball 18, through the mask opening 26. The resulting assembly is then placed inside a solder evaporator and about 1.3 mil of tin 23, are deposited on the area exposed by the mask.

This assembly is then disassembled and the mask 20, is removed. The solder ball 18, with the tin cap 23, is then reflowed. In a preferred embodiment the capped solder ball 18, is reflowed in a dry nitrogen, forming gas or hydrogen environment, to name a few.

In another preferred embodiment, the covered solder ball 18, is reflowed in a pure hydrogen ambient to a maximum temperature of at most about 200° C. This operation forms an eutectic alloy on the top of the high melting point solder ball 18. The eutectic alloy 43, so formed remains discrete even after several reflows. The capacitor 10, can then be joined to a substrate on an organic carrier card (not shown) by any means known in the art. Preferably, the substrate has copper features.

Additional steps to facilitate joining can be done but are not shown. For example, flux is dispensed on the copper features of the substrate. The solder balls on the capacitors are aligned to the copper features on the organic card. The assembled parts would then be placed in a belt furnace. The furnace has a nitrogen ambient and the assembled parts are heated. In a preferred embodiment the heat is supplied by at least one focused IR lamp. When the assembled parts are heated in the furnace the eutectic solder on top of the high melting point solder ball melts, and a joint is formed on the object. For example, the circuit carrier cards can be interposers, first level packages, PCMCIA (Personal Computer Memory Card Industry Association) cards, disc drives, second level packages or motherboards. For protection, a suitable epoxy or polyimide based encapsulation material could be placed under the capacitor, with the encapsulation material surrounding the C4 solder balls.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A package comprising, a device carrier and at least one capacitor electrically connected to said device carrier with at least one solder ball, wherein said solder ball comprises a high melting point solder in communication with an electrical feature on said capacitor, a portion of said solder ball having a coating of at least one low melting point metal, and wherein a portion of said low melting point metal forms an eutectic fillet, and wherein said eutectic fillet is in electrical contact with said device carrier and thereby forms said package.

2. The package of claim 1, wherein said solder ball is selected from a group consisting of Ag, Au, Bi, In, Pb, Sn, or alloys thereof.

3. The package of claim 1, wherein said solder ball comprises a lead-tin alloy.

4. The package of claim 1, wherein said solder ball comprises a lead-tin alloy, and wherein said alloy contains at least about 2 percent and at most about 10 percent tin.

5. The package of claim 1, wherein said solder ball comprises a lead-tin alloy, and wherein said alloy contains at least about 3 percent tin.

6. The package of claim 1, wherein said low melting point metal is selected from a group consisting of bismuth, indium, tin, or alloys thereof.

7. The package of claim 1, wherein said solder ball has an exposed surface, and wherein said low melting point metal covers at least about 10 percent and at most about 90 percent of said exposed surface of said solder ball.

8. The package of claim 1, wherein said solder ball has an exposed surface, and wherein said low melting point metal covers at least about 30 percent and at most about 50 percent of said exposed surface of said solder ball.

9. The package of claim 1, wherein said solder ball has an exposed surface, and wherein said low melting point metal covers at least 35 percent of said exposed surface of said solder ball.

10. The package of claim 1, wherein average thickness of said low melting point metal is between about 15 and about 50 micrometers.

11. The package of claim 1, wherein average thickness of said low melting point metal is about 35 micrometers.

12. The package of claim 1, wherein said low melting point metal forms a eutectic volume of between about 5 percent and about 90 percent of volume of said solder ball.

13. The package of claim 1, wherein said low melting point metal forms a eutectic volume which is at least about 35 percent of the volume of said solder ball.

14. The package of claim 1, wherein said solder ball is on at least one contacting means, and wherein said at least one contacting means comprises at least one solder wettable pad and at least one shorting bar.

15. The package of claim 1, wherein said package has at least one electronic device secured thereto.

16. The package of claim 15, wherein said solder ball is on at least one contacting means, and wherein said at least one contacting means comprises at least one solder wettable pad and at least one shorting bar.

17. The package of claim 1, wherein said capacitor is secured to an object, and wherein said object is selected from a group consisting of circuit carrier card and substrate.

18. The package of claim 17, wherein said circuit carrier card is an organic circuit carrier card.

19. The package of claim 18, wherein said organic circuit carrier card is selected from the group consisting of epoxy and polyimide.

20. The package of claim 17, wherein said circuit carrier card is selected from a group consisting of an interposer, a first level package, a PCMCIA (Personal Computer Memory Card Industry Association) card, a disc drive, a second level package, or a mother board.

21. A capacitor comprising at least one solder ball, wherein said solder ball comprises a high melting point solder in communication with an electrical feature on said capacitor, a portion of said solder ball having a coating of at least one low melting point metal, and thereby forming said capacitor.

22. A capacitor comprising at least one solder ball, wherein said solder ball comprises a high melting point solder in communication with an electrical feature on said capacitor, a portion of said solder ball having a coating of at least one eutectic solder, and thereby forming said capacitor.

* * * * *